United States Patent
Johnson et al.

(10) Patent No.: US 6,531,414 B1
(45) Date of Patent: Mar. 11, 2003

(54) METHOD OF OXIDIZING STRAIN-COMPENSATED SUPERLATTICE OF GROUP III-V SEMICONDUCTOR

(75) Inventors: Frederick G. Johnson, Lanham, MD (US); Bikash Koley, College Park, MD (US); Linda M. Wasiczko, College Park, MD (US)

(73) Assignee: The United States of America as represented by The National Security Agency, Washington, DC (US)

( * ) Notice: Subject to any disclaimer, the term of this patent is extended or adjusted under 35 U.S.C. 154(b) by 0 days.

(21) Appl. No.: 09/563,457

(22) Filed: May 2, 2000

Related U.S. Application Data

(60) Provisional application No. 60/132,596, filed on May 5, 1999.

(51) Int. Cl.[7] .................... H01L 21/31; H01L 21/469
(52) U.S. Cl. .................... 438/785; 438/767; 438/125; 257/9; 257/15
(58) Field of Search .................... 438/767, 444, 438/627, 690, 704, 724, 734, 757, 785, 117, 125, 232, 773, 930; 257/9, 15, 18

(56) References Cited

U.S. PATENT DOCUMENTS

| | | | |
|---|---|---|---|
| 5,262,360 A | | 11/1993 | Holonyak et al. |
| 5,311,035 A | * | 5/1994 | Nire .................... 257/15 |
| 5,373,522 A | | 12/1994 | Holonyak et al. |
| 5,567,980 A | | 10/1996 | Holonyak et al. |
| 5,618,761 A | * | 4/1997 | Eguchi et al. .................... 438/785 |
| 5,696,023 A | | 12/1997 | Holonyak et al. |
| 5,825,077 A | * | 10/1998 | Liu et al. .................... 257/25 |
| 5,907,164 A | * | 5/1999 | Nakayama .................... 257/192 |
| 6,056,994 A | * | 5/2000 | Paz de Araujo et al. .................... 427/96 |
| 6,100,203 A | * | 8/2000 | Kil .................... 438/745 |
| 6,156,661 A | * | 12/2000 | Small .................... 438/692 |
| 6,207,465 B1 | * | 3/2001 | Cuchiaro et al. .................... 438/3 |
| 6,235,547 B1 | * | 5/2001 | Sakuma et al. .................... 438/44 |
| 6,261,855 B1 | * | 7/2001 | Suzuki .................... 438/23 |
| 6,269,109 B1 | * | 7/2001 | Jewell .................... 372/43 |
| 6,270,395 B1 | * | 8/2001 | Towery et al. .................... 451/41 |

FOREIGN PATENT DOCUMENTS

| | | |
|---|---|---|
| JP | 3-290614 A | * 12/1991 |
| JP | 4-343438 A | * 11/1992 |
| JP | 11-111964 A | * 4/1999 |

OTHER PUBLICATIONS

Iwai et al. "High performance 1.3-/spl mu/m InAsP strained-layer quantum-well ACIS (Al-oxide confined inner stripe) lasers"; pp. 694-700; IEEE Journal on Selected Topics on Quantum Electronics; May-Jun. 1998 Nara, Japan.*

Hintermaier et al. United States Patent Application Publication US 2001/0041374 A1.*

Dupuis, Russell D.; "III-V Compound Semiconductor Native Oxides-The Newest of the Semiconductor Materials"; pp. 32-34; Compound Semiconductor Jan./Feb. 1997.*

(List continued on next page.)

Primary Examiner—Olik Chaudhuri
Assistant Examiner—Fernando Toledo
(74) Attorney, Agent, or Firm—Robert D. Morelli

(57) ABSTRACT

A method of forming a native oxide from at least one strain-compensated superlattice of Group III-V semiconductor material, where each at least one superlattice includes two monolayers of a Group III-V semiconductor material and at least two monolayers of an aluminum-bearing Group III-V semiconductor material. The method entails exposing each at least one superlattice to a water-containing environment and a temperature of at least about 425 degrees Celsius to convert at least a portion of said superlattice to a native oxide. The native oxide thus formed is useful in electrical and optoelectrical devices, such as lasers.

18 Claims, 2 Drawing Sheets

OTHER PUBLICATIONS

Russell D. Dupuis, "III–V Compound Semiconductor Native Oxides—The Newest of the Semiconductor Device Materials", Compound Semiconductor Jan./Feb. 1997, USA pp. 32–34.

J.M.Dallesasse et al., "Hydrolyzation oxidation of $Al_xGa_{1-x}As$–AlAs–GaAs Quantum Well Heterostructures and Superlattices", Appl. Phys. Lett. vol. 57, No. 26, Dec. 24, 1990, Amer. Inst. of Phys., USA pp. 2844–2846.

H. Gebretsadik, et al., "Lateral Oxidation of INAlAs in INP–Based Heterostructures for Long Wavelength Vertical Cavity Surface Emitting Laser Applications," Appl. Phys. Lett., vol. 72, No. 2, Jan. 12, 1998, USA, Amer. Inst. of Phys. pp. 135–137.

P. Legay et al., "Oxide Confining Layer on an INP Substrate", Journal of Applied Physics, vol. 85, No. 4, Feb. 15, 1999, USA, Amer. Inst. of Phys. pp. 2428–2430.

* cited by examiner

| FORMING STRAIN-COMPENSATED GROUP III-V SUPERLATTICE, WHERE EACH SUPERLATTICE INCLUDES ALUMINUM-BEARING MATERIAL AND MATERIAL THAT DOES NOT | — 1 |

| EXPOSING SUPERLATTICE TO WATER VAPOR AND TEMPERATURE OF ABOUT 425 DEGREES CELSIUS TO OXIDIZE A PORTION OF THE SUPERLATTICE | — 2 |

METHOD OF OXIDIZING STRAIN-COMPENSATED SUPERLATTICE OF GROUP III-V SEMICONDUCTOR

This application claims the benefit of U.S. Provisional Application No. 60/132,596, filed May 5, 1999.

FIELD OF THE INVENTION

The present invention relates, in general, to semiconductor device manufacturing process and, in particular, to oxidation.

BACKGROUND OF THE INVENTION

In an article entitled "III–V Compound Semiconductor Native Oxides—The Newest of the Semiconductor Device Materials," published in *Compound Semiconductor*, January 1997, Russell D. DuPuis chronicled the development of the semiconductor oxide. Mr. DuPuis points out that Carl Frosch, of Bell Telephone Laboratories, disclosed in 1955 that a silicon wafer could be oxidized by exposing it to high temperature (e.g., 1050 degrees Celsius) and water vapor (i.e., steam) in either oxygen or nitrogen to form a layer of silicon dioxide thereon. The oxide, or native oxide, exhibited sufficiently high insulating properties to be used as an insulator in electronic devices manufacture in silicon.

It was widely thought that an insulating oxide could not be grown on Group III–V semiconductor materials with insulating properties as good as silicon dioxide. In 1990, Nick Holonyak, Jr. et al. discovered that such an oxide could be made. The discovery was described in U.S. Pat. Nos. 5,262,360, entitled "AlGaAs NATIVE OXIDE"; 5,373,522, entitled "SEMICONDUCTOR DEVICES WITH NATIVE ALUMINUM OXIDE REGIONS"; 5,696,023, entitled "METHOD OF MAKING ALUMINUM GALLIUM ARSENIDE SEMICONDUCTOR DEVICE WITH NATIVE OXIDE LAYER"; and 5,567,980, entitled "NATIVE OXIDE OF AN ALUMINUM-BEARING GROUP III–V SEMICONDUCTOR." U.S. Pat. Nos. 5,262,360; 5,373,522; 5,696,023; and 5,567,980 are hereby incorporated by reference into the specification of the present invention. The discovery was also described in an article entitled "Hydrolyzation oxidation of $Al_xGa_{1-x}As$—AlAs—GaAs quantum well heterostructures and superlattices," by J. M. Dallesasse, N. Holonyak, Jr., A. R. Sugg, T. A. Richard, and N. El-Zein, published by the American Institute of Physics in *Appl. Phys. Lett.*, 57, Dec. 24, 1990, pp. 2844–2846. The discovery is, essentially, exposing an aluminum-bearing Group III–V semiconductor material to high temperature (e.g., 375 degrees Celsius) and water vapor in nitrogen until a user-definable portion of the aluminum-bearing Group III–V semiconductor material is oxidized. Partial oxidation is useful in an electronic device for confining current flow along a user-definable path. Complete oxidation is useful in an electronic device for forming an insulator or part of a mirror.

Other relevant prior art includes an article by H. Gebretsadik et al., entitled "Lateral oxidation of InAlAs in InP-based heterostructures for long wavelength vertical cavity surface emitting laser application," published by the American Institute of Physics in *Appl. Phys. Lett.*, Jan. 12, 1998, on pp. 135–137, and an article by P. Legay et al., entitled "Oxide confining layer on an InP substrate," published by the American Institute of Physics in the *Journal of Applied Physics*, Vol. 85, No. 4, Feb. 15, 1999. Each article discloses a method of oxidizing a particular Group III–V semiconductor material on an InP substrate.

Most of the prior art methods of forming an oxide in a Group III–V semiconductor material involve the wet thermal oxidation of an $Al_xGa_{(1-x)}As$ layer because such methods are repeatable and are very controllable. However, such oxidation methods are limited to high aluminum content Group III–V semiconductor materials such as $Al_xGa_{(1-x)}As$ lattice matched to GaAs. Lattices are matched to avoid introducing any strain in the resulting structure which might reduce the reliability of the structure. Devices based on such materials are too slow and operate at the wrong wavelength for use in a fiber optic communication system. However, devices based on Group III–V semiconductor materials lattice matched to Indium Phosphide (InP) are fast enough and operate at the correct wavelength (i.e., 1.2 um to 1.6 um) for use in a fiber optic communication system. Unfortunately, the only high aluminum containing Group III–V semiconductor materials that are lattice matched to InP are $AlAs_xSb_{(1-x)}$ materials with an x value near 0.5. During the oxidation process, the metallic elements (e.g., As and Sb) separate and forms conductive interfacial layers which lead to increased strain in the oxidized structure. The strain may reduce the reliability of the structure.

There is no x value for which $Al_xGa_{(1-x)}As$ is lattice matched to InP. $Al_yIn_{(1-y)}As$ materials are more suitable but are only lattice matched to InP for y values near 0.48, which is a relatively low aluminum content for oxidation purposes. Therefore, present oxidation methods are not easily transferred to devices based on InP substrates. The maximum aluminum composition of an arsenide-based ternary material that is lattice matched to InP is $Al_{0.48}In_{0.52}As$. Because of the relatively small aluminum content, the oxidation rate in this material is very slow (~1 um/hour at 500 degrees Celsius).

SUMMARY OF THE INVENTION

It is an object of the present invention to form a native oxide on a Group III–V semiconductor without being required to match the lattice of a Group III–V semiconductor material.

It is another object of the present invention to form a native oxide on a Group III–V semiconductor in a timely manner that is compatible with device production methods so that the devices made therefrom are not degraded during the oxidation process of the present method.

The present invention is a method of forming a native oxide.

The first step of the method is forming at least one strain-compensated superlattice of Group III–V semiconductor material, where each at least one strain-compensated superlattice includes at least two monolayers of a Group III–V semiconductor material and at least two monolayers of an aluminum-bearing Group III–V semiconductor material. In the preferred embodiment, the at least one strain-compensated superlattice is InAs/AlAs, where each at least one strain-compensated superlattice includes at least two monolayers of InAs and at least two monolayers of AlAs.

The preferred structure on which the present method is performed includes an InP substrate, 3000 angstroms of an InP layer on the InP substrate, the at least one strain-compensated superlattice on the InP layer, and a 500 angstrom InP cap layer on the at least one superlattice.

The second step of the method is exposing each at least one strained-compensated superlattice to a water-containing environment and a temperature of at least about 425 degrees Celsius to convert at least a portion of said at least one strain-compensated superlattice to a native oxide. The at least one strain-compensated superlattice may be oxidized completely through or to a user-definable depth on either or both sides.

One oxidation method involves exposing each at least one strained compensated superlattice to nitrogen saturated with water vapor at a temperature of about 500 degrees Celsius, where the nitrogen flowing at a rate of 3.6 l/minute is bubbled through a water bubbler at a temperature of from 70 to 95 degrees Celsius. Another oxidation method involves exposing each at least one strained compensated superlattice to an electrolyte such as $H_2O_2$. Yet another oxidation method involves exposing each at least one strained compensated superlattice to oxygen plasma.

BRIEF DESCRIPTION OF THE DRAWINGS

FIG. 1 is a list of steps of the present invention; and

DETAILED DESCRIPTION

Figure 2:
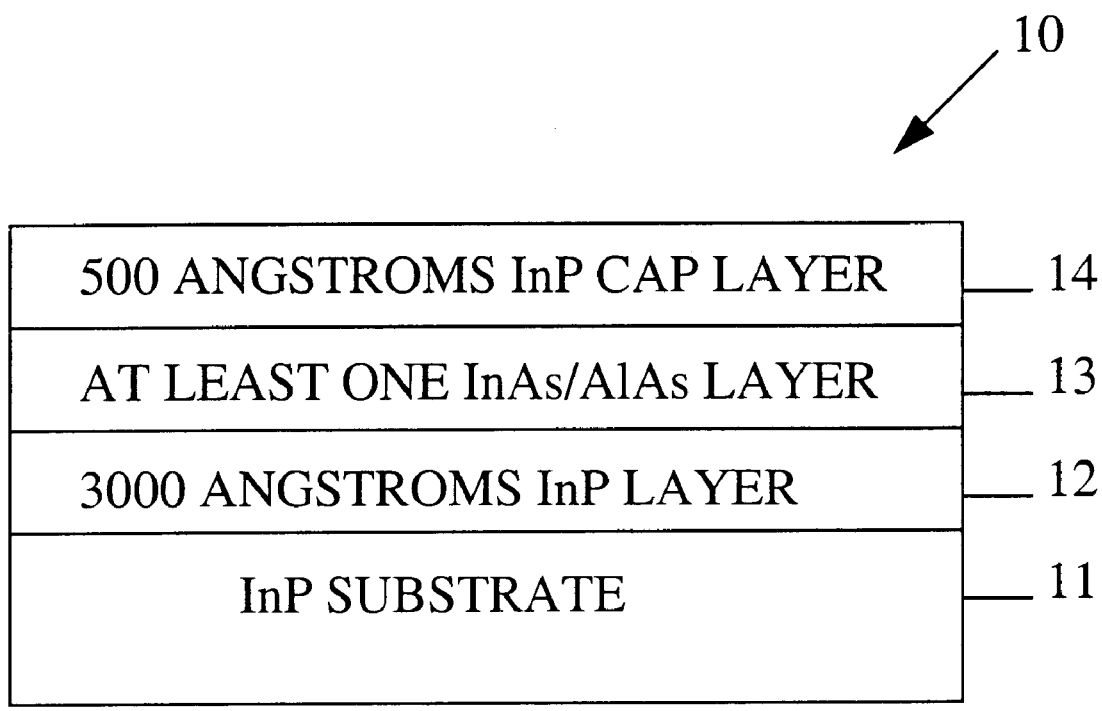
FIG. 2 is a cross-sectional view of the preferred structure on which the present invention is used.

The present invention is a method of selectively and rapidly forming a native oxide layer in a Group III–V semiconductor material in a manner that does not require lattice matching. Lattice matching may be impossible to achieve using some Group III–V semiconductor materials. For those Group III–V semiconductor materials that may be lattice matched, a sufficient amount of aluminum may not result to allow for rapid oxidation. If an oxidation process is not rapid, the device may be degraded due to lengthy exposure to a high temperature. The present invention discloses a method that overcomes both of these problems.

FIG. 1 is a list of the steps of the present method.

The first step 1 is forming at least one strain-compensated superlattice of Group III–V semiconductor material, where each at least one strain-compensated superlattice includes at least two monolayers of a Group III–V semiconductor material that does not include aluminum and at least two monolayers of an aluminum-bearing Group III–V semiconductor material. The Group III–V material without aluminum and the Group III–V material with aluminum have lattice constants that are different from each other and, therefore, may be arranged to cancel out each other so that there is no strain in the resulting superlattice. If the Group III–V material without aluminum and the Group III–V material with.aluminum have lattice constants that are exactly opposite from each other then the number of-monolayers of the Group III–V semiconductor material that does not include aluminum will be the same as the number of monolayers of the aluminum-bearing Group III–V semiconductor material. However, if the Group III–V material without aluminum and the Group III–V material with aluminum have lattice constants that are not exactly opposite from each other then the number of monolayers of the Group III–V semiconductor material that does not include aluminum may be different from the number of monolayers of the aluminum-bearing Group III–V semiconductor material. That is, the number of monolayers of the Group III–V material without aluminum and the number of monolayers of the Group III–V material with aluminum are set so that there is no strain is in the resulting superlattice. To achieve this, the number of monolayers of the Group III–V material without aluminum may be different from the number of monolayers of the Group III–V material with aluminum. In the preferred embodiment, the at least one strain-compensated superlattice of Group III–V semiconductor material is InAs/AlAs, where each at least one superlattice of InAs/AlAs includes at least two monolayers of InAs and at least two monolayers of AlAs. Such a superlattice may be used in InP based optical devices whereas devices based on AlGaAs may not.

FIG. 2 is a cross-sectional view of the preferred structure 10 on which the present method is performed. The preferred structure includes an InP substrate 11 of any type (i.e., n-type or p-type). A 3000 angstrom layer of InP 12 is formed on the InP substrate 11. At least one strain-compensated InAs/AlAs superlattice 13 of at least 1000 angstroms is formed on the 3000 angstrom layer of InP 12. In the preferred embodiment, the at least 500 angstrom cap layer of InP 14 is formed on the at least one strain-compensated InAs/AlAs layer 13.

The second step 2 of the method of FIG. 1 is exposing each at least one strained. compensated superlattice to a water-containing environment and a temperature of at least about 425 degrees Celsius to convert at least a portion of said at least one strain-compensated superlattice to a native oxide. In the preferred embodiment, the temperature is in the range of approximately 480 to 500 degrees Celsius. The at least one strain-compensated superlattice maybe oxidized completely through or to a user-definable depth on either or both sides.

The second step may be achieved by exposing each at least one strained compensated superlattice to nitrogen saturated with water vapor at a temperature of about 500 degrees Celsius, where the nitrogen flowing at 3.6 l/minute is bubbled through a water bubbler at a temperature in the range of from 70 to 95 degrees Celsius.

The second step 2 may also be achieved by either exposing each at least one strained compensated superlattice to an electrolyte such as $H_2O_2$ or to oxygen plasma.

What is claimed is:

1. A method of forming a native oxide, comprising the steps of:
    (a) forming at least one strain-compensated superlattice of Group III–V semiconductor material, where each at least one superlattice of Group III–V semiconductor material includes at least two monolayers of a non-aluminum-bearing Group III–V semiconductor material and at least two monolayers of an aluminum-bearing Group III–V semiconductor material; and
    (b) exposing each at least one strain-compensated superlattice of Group III–V semiconductor material to a water-containing environment and a temperature of at least about 425 degrees Celsius to convert at least a portion of said at least one strain-compensated superlattice of Group III–V semiconductor material to an oxide.

2. The method of claim 1, wherein said step of exposing each at least one strained compensated superlattice to a water-containing environment and a temperature of at least about 425 degrees Celsius is comprised of the step of exposing each at least one strained compensated superlattice to nitrogen saturated with water vapor at a temperature of about 500 degrees Celsius.

3. The method of claim 2, wherein said step of exposing each at least one strained compensated superlattice to nitrogen saturated with water vapor is comprised of the step of exposing each at least one strained compensated superlattice to nitrogen bubbling through a water bubbler.

4. The method of claim 3, wherein said step of exposing each at least one strained compensated superlattice to nitrogen saturated with water vapor is comprised of the step of exposing each at least one strained.compensated superlattice to nitrogen flowing at a rate of 3.6 l/minute bubbling through a water bubbler at a temperature in the range of from 70 to 95 degrees Celsius.

5. The method of claim 1, wherein said step of exposing each at least one strained compensated superlattice to a water-containing environment and a temperature of at least about 425 degrees Celsius is comprised of the step of exposing each at least one strained compensated superlattice to an electrolyte.

6. The method of claim 5, wherein said step of exposing each at least one strained compensated superlattice to an electrolyte is comprised of the step of exposing each at least one strained compensated superlattice to $H_2O_2$.

7. The method of claim 1, wherein said step of exposing each at least one strained compensated superlattice to a water-containing environment and a temperature of at least about 425 degrees Celsius is comprised of the step of exposing each at least one strained compensated superlattice to oxygen plasma.

8. A method of forming a native oxide, comprising the steps of:
   a) forming an InP layer on an InP substrate;
   b) forming at least one strain-compensated superlattice of InAs/AlAs on the InP layer, where each at least one strain-compensated superlattice includes at least two monolayers of InAs and at least two monolayers of AlAs;
   c) forming an InP cap layer on the at least one strain-compensated superlattice of InAs/AlAs; and
   d) exposing each at least one strained compensated superlattice to a water-containing environment and a temperature of at least about 425 degrees Celsius to convert at least a portion of said at least one strain-compensated superlattice to a native oxide.

9. The method of claim 8, wherein said step of forming an InP layer on an InP substrate is comprised of the step of forming 3000 angstroms of InP on an InP substrate.

10. The method of claim 8, wherein said step of forming at least one strain-compensated superlattice of InAs/AlAs on the InP layer is comprised of the step of forming at least one strain-compensated superlattice of InAs/AlAs on the InP to a thickness of 1000 angstroms.

11. The method of claim 8, wherein said step of forming an InP cap layer is comprised of the step of forming an InP cap layer to a thickness of 500 angstroms.

12. The method of claim 8, wherein said step of exposing each at least one strained compensated superlattice to a water-containing environment and a temperature of at least about 425 degrees Celsius is comprised of the step of exposing each at least one strained compensated superlattice to nitrogen saturated with water vapor at a temperature of about 500 degrees Celsius.

13. The method of claim 12, wherein said step of exposing each at least one strained compensated superlattice to nitrogen saturated with water vapor is comprised of the step of exposing each at least one strained compensated superlattice to nitrogen bubbling through a water bubbler.

14. The method of claim 13, wherein said step of exposing each at least one strained compensated superlattice to nitrogen saturated with water vapor is comprised of the step of exposing each at least one strained compensated superlattice to nitrogen flowing at a rate of 3.6 l/minute bubbling through a water bubbler at a temperature in the range of from 70 to 95 degrees Celsius.

15. The method of claim 8, wherein said step of exposing each at least one strained compensated superlattice to a water-containing environment and a temperature of at least about 425 degrees Celsius is comprised of the step of exposing each at least one strained compensated superlattice to an electrolyte.

16. The method of claim 5, wherein said step of exposing each at least one strained compensated superlattice to an electrolyte is comprised of the step of exposing each at least one strained compensated superlattice to $H_2O_2$.

17. The method of claim 8, wherein said step of exposing each at least one strained compensated superlattice to a water-containing environment and a temperature of at least about 425 degrees Celsius is comprised of the step of exposing each at least one strained compensated superlattice to oxygen plasma.

18. The method of claim 1, wherein said step of forming at least one strain-compensated superlattice of Group III–V semiconductor material is comprised of the step of forming at least one strain-compensated superlattice of InAs/AlAs, where each at least one superlattice of InAs/AlAs includes at least two monolayers of InAs and at least two monolayers of AlAs.

* * * * *